(12) United States Patent
Yu et al.

(10) Patent No.: US 7,178,082 B2
(45) Date of Patent: Feb. 13, 2007

(54) APPARATUS AND METHOD FOR ENCODING A LOW DENSITY PARITY CHECK CODE

(75) Inventors: Nam-Yul Yu, Suwon-si (KR); Min-Goo Kim, Yongin-si (KR); Gang-Mi Gil, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 461 days.

(21) Appl. No.: 10/834,069

(22) Filed: Apr. 29, 2004

(65) Prior Publication Data

US 2004/0221223 A1    Nov. 4, 2004

(30) Foreign Application Priority Data

Apr. 29, 2003  (KR) .................. 10-2003-0027348

(51) Int. Cl.
*H03M 13/11* (2006.01)

(52) U.S. Cl. .................. 714/752; 714/800; 714/801

(58) Field of Classification Search ................ 714/752, 714/800, 801; *H03M 13/11*
See application file for complete search history.

(56) References Cited

U.S. PATENT DOCUMENTS

| 7,089,479 | B2 * | 8/2006 | Matsumoto ................. 714/758 |
| 2004/0034828 | A1 * | 2/2004 | Hocevar ..................... 714/800 |
| 2004/0255217 | A1 * | 12/2004 | Garrett et al. ............. 714/746 |

* cited by examiner

*Primary Examiner*—R. Stephen Dildine
(74) *Attorney, Agent, or Firm*—Roylance, Abrams, Berdo & Goodman, L.L.P.

(57) ABSTRACT

An apparatus and method for generating an encoding matrix for a low density parity check (LDPC) code having a dual-diagonal matrix as a parity check matrix are disclosed. The apparatus and method construct an information sub-matrix of the encoding matrix with a predetermined number of square matrixes according to a predetermined code rate such that each of the square matrixes has columns and rows with a weight of 1 and has a different offset value, combine the square matrixes with the dual-diagonal matrix, and perform inter-row permutation on the information sub-matrix.

6 Claims, 11 Drawing Sheets

APPARATUS AND METHOD FOR ENCODING A LOW DENSITY PARITY CHECK CODE

PRIORITY

This application claims priority under 35 U.S.C. § 119(a) to an application entitled "Apparatus and Method for Encoding Low Density Parity Check Code" filed in the Korean Intellectual Property Office on Apr. 29, 2003 and assigned Serial No. 2003-27348, the entire contents of which are incorporated herein by reference.

BACKGROUND OF THE INVENTION

1. Field of the Invention

The present invention relates generally to an encoding apparatus and method in a communication system. In particular, the present invention relates to an apparatus and method for encoding a low density parity check (LDPC) code in a communication system.

2. Description of the Related Art

A communication system typically performs encoding on transmission data prior to transmission of the data. Such an encoding method includes an iterative encoding technique, a convolutional encoding technique, a turbo encoding technique, and a low density parity encoding technique. The encoding techniques can be uniquely used according to their characteristics, and research is currently being conducted on the low density parity encoding technique which is expected to be used in a next generation mobile communication system.

The low density parity encoding technique is a type of block encoding for encoding information bits using an encoding matrix before transmission of data. A method of performing the block encoding using an encoding matrix in which the number of elements of '1' is very small, i.e., most elements thereof have a value of '0', is called the "low density parity encoding technique". Such a low density parity encoding technique uses a parity check matrix comprised of rows and columns each having a spare value of '1'. The rows and columns each can express a structure of a code using a factor graph to which a check node and a variable node are mapped. Iterative decoding can be achieved based on a sum-product algorithm defined by the factor graph. An iterative decoding process performed on the factor graph can be implemented in a parallel structure, and can greatly reduce decoding time due to performing such a parallel process. Compared with a turbo code, an LDPC code has a low frame error rate (FER) because the LDPC code, compared with the turbo code, has a larger minimum distance as a block size increases. In addition, the LDPC code generally does not show an error floor even at a relatively high signal-to-noise ratio (SNR). Further, the LDPC code can perform error detection and efficient decoding interruption on a decoded codeword even without the performance of a cyclic redundancy check (CRC) by using orthogonality of a codeword and a parity check matrix.

However, the LDPC code is limited in that an encoding process of calculating a codeword for input information using a parity check matrix is complex compared with that of the turbo code. That is, while the turbo code can undergo real-time encoding in a simple manner via iteration by a recursive systematic convolutional encoder, the LDPC code has encoding complexity approaching a square of a block length according to a structure of a parity check matrix that defines the code.

A description will now be made of known methods for generating a parity check matrix for the LDPC code.

Construction Method by MacKay and Neal

MacKay and Neal have proposed the following M×N parity check matrix generation method in a paper where they have newly introduced an LDPC code.

Structure 1

An M×N parity check matrix is randomly generated such that the number of is in each column is fixed at 't' and the number of 1s in each row is constant, if possible. In addition, the M×N parity check matrix is randomly generated such that an overlap between two particular columns does not exceed '1' to prevent the occurrence of a length=4 cycle. FIG. 1A illustrates a structure of a rate=½ matrix in which the number of 1s in each column is 3. In FIG. 1A, arrows on circles denoted by reference numerals 101 and 103 indicate that even though any row and column are selected from the matrix, the number of 1s in the selected row and column is 3.

Structure 2

Columns with a weight 2 are generated for the first M/2 columns such that two particular columns should not overlap with each other, and columns with a weight 3 are randomly generated for the remaining columns such that an overlap between two particular columns should not exceed 1. FIG. 1B illustrates a structure of a rate=⅓ matrix constructed such that an overlap between two particular columns with a weight 3 should not exceed 1. In FIG. 1B, diagonals denoted by reference numerals 111 and 113 indicate that the matrix has the stated number of 1s, and an arrow on a circle denoted by a reference numeral 115 indicates that even though any row and column are selected from the matrix, the number of 1s in the selected row and column is 3.

Structure 1 and Structure 2

Several columns are removed from the parity check matrix so that a cycle of a particular length 1 should not occur when the parity check matrix generated by FIGS. 1A and 1B is expressed with a factor graph. In this manner, a parity check matrix satisfying the two structures illustrated in FIGS. 1A and 1B can be constructed.

In addition, parity check matrixes shown in FIGS. 1C and 1D can be generated through a non-overlapping permutation matrix. In FIGS. 1C and 1D, arrowed circles or elliptic curves indicate random permutations of columns. A method of FIG. 1C is identical to a parity check matrix generation method proposed by Gallager. Thereafter, MacKay has proposed a method of generating a parity check matrix shown in FIG. 2 taking efficient encoding and decoding performances into account. In the matrix of FIG. 2, if it is assumed that the total number of rows is n and the total number of columns is n–k, 1s are arranged in a diagonal direction denoted by reference numeral 201 for (n–k) elements from a $(k+1)^{th}$ element, and if the parity check matrix is constructed such that even though any row and column are selected at the last part denoted by reference numeral 203 the number of 1s in the selected row and column is 3, it is noted that decoding performance is improved.

The methods proposed by MacKay and Neal correspond to an earlier version of the LDPC code generation method. However, conventional parity check matrix generation methods have difficulty in reducing encoding complexity and also have difficulty in generating LDPC codes having various code rates and various block sizes.

Construction Method by Generalized LDPC Code

T. Zahng and K. Parhi have generated a generalized LDPC code structure-based parity check matrix that can be efficiently encoded and decoded, and have implemented a 54-Mbps decoder for LDPC codes with a field programmable gate array (FPGA), using the generated parity check matrix. Zahng and Parhi have generated a (3,6) regular LDPC code by constructing a parity check matrix in the following type, and have proposed a structure of a partly parallel decoder for the generated (3,6) regular LDPC code. The proposed structure has the following form.

$$H = \begin{bmatrix} H_1 \\ H_2 \\ H_3 \end{bmatrix}$$

In FIG. 3, each of sub-matrixes $I_{x,y}$ constituting $H_1$ is an L×L unit matrix, and each of sub-matrixes $P_{x,y}$ constituting $H_2$ is a cyclic-shifted form of the L×L unit matrix. That is, if $T^u(Q)$ is defined as a right shift operation on each column in a matrix Q by u, $P_{x,y}$ is an L×L matrix that satisfies $$P_{x,y} = T^u(I), \text{ where } u = ((x-1) \cdot y) \bmod L \quad (1)$$

It should be understood from Equation (1) that if a parity check matrix for an LDPC code is constructed with a sub-matrix $H_3$ located in the bottom of FIG. 3, it becomes a random parity check matrix in which H does not have a cycle value of 4. A partly parallel LDPC decoder that simultaneously performs variable node processing and check node processing on each of sub-matrixes through a T. Zahng and K. Parhi's parity check matrix having a structure shown in FIG. 3 was implemented. That is, the decoder was implemented such that it has a total of $K^2$ variable node units (VNUs) each having L memory locations, has k check node units (CNUs) for each sub-matrix, and updates memory locations through connections for them every clock. Therefore, 2L clocks are required for one iteration.

A structure of the decoder is characterized in that an LDPC code was designed based on the concept of a generalized LDPC structure and a partly parallel decoder for it was actually implemented through Xilinx Virtex FPGA. However, the decoder lacks flexibility for more various code rates and block sizes, and cannot secure efficient systematic encoding.

Construction by Semi-Random Parity Check Matrix

L. Ping et al. have proposed a new method for constructing a parity check matrix for an LDPC code using a semi-random technique. That is, they have proposed a method for separating a parity check matrix into two sub-matrixes, and generating only one sub-matrix in a random manner and the other sub-matrix in a deterministic manner. In addition, they have shown through experiment that more efficient real-time encoding is possible by constructing the parity check matrix in this manner and decoding performance is also not inferior to that of a fully random parity check matrix.

A semi-random parity check matrix H is comprised of two sub-matrixes, as defined by $H = [H^d | H^p]$. Here, $H^p$ denotes an (n−k)×(n−k) sub-matrix corresponding to a parity part of the parity check matrix H, and $H^d$ denotes an (n−k)×k sub-matrix corresponding to an information part of the parity check matrix H. A particular codeword c is also constructed in the form of $c = [c^d | c^p]$, where $c^d$ denotes a part corresponding to a systematic information symbol of the codeword c and $c^p$ denotes a part corresponding to a parity symbol of the codeword c. The parity part $H^p$ of the parity check matrix H is constructed in the form of a deterministic dual-diagonal matrix as shown below.

$$H^p = \begin{pmatrix} 1 & 0 & \cdots & 0 \\ 1 & 1 & \cdots & 0 \\ 0 & \ddots & \ddots & 0 \\ 0 & 0 & 1 & 1 \end{pmatrix} \quad (2)$$

Further, it has been proposed that the information part $H^d$ of the parity check matrix H be randomly generated, with a column weight and a row weight maintained. If the $H^p$ and the $H^d$ are constructed in this manner and the parity check matrix H is constructed according thereto, each parity symbol is constructed using orthogonality of the parity check matrix and the codeword as shown below.

$$[H^d | H^p][c^d | c^p]^T = 0 \quad \Box \quad p_1 = \sum_j h^d_{i,j} d_j \text{ and } p_i = p_{i-1} + \sum_j h^d_{i,j} d_j \quad (3)$$

Based on Equation (3), (n−k) parity symbols can be simply calculated on a real-time basis using input information symbols.

R. Echard et al. have proposed a simply encoder structure capable of performing real-time encoding using Equation (4) below based on the fact that an inverse matrix of a dual-diagonal matrix is a triangular matrix.

$$H^p c^p = v = H^d c^d \quad \Box \quad c^p = [H^p]^{-1} v \quad (4)$$

$$\text{where } [H^p]^{-1} = \begin{pmatrix} 1 & 0 & \cdots & 0 \\ 1 & 1 & \cdots & 0 \\ 1 & \ddots & \ddots & 0 \\ 1 & 1 & 1 & 1 \end{pmatrix} : \text{ Lower triangular matrix}$$

For an efficient decoder structure, R. Echard et al. subdivided the sub-matrix $H^d$ into new sub-matrixes. Each of the sub-matrixes was defined by a π-rotation pattern for a particular permutation matrix. A sub-matrix $H^d$ of a parity check matrix for a rate=½ LDPC code is constructed as shown below.

$$H^d = \begin{bmatrix} \pi_A & \pi_B & \pi_C & \pi_D \\ \pi_B & \pi_C & \pi_D & \pi_A \\ \pi_C & \pi_D & \pi_A & \pi_B \\ \pi_D & \pi_A & \pi_B & \pi_C \end{bmatrix} \quad (5)$$

If a sub-matrix $\pi_A$ constituting the $H^d$ is defined as a permutation matrix for a particular unit matrix, $\pi_B$, $\pi_C$ and $\pi_D$ denote sub-matrixes determined by rotating the sub-matrix $\pi_A$ by −π/2, π and π/2, respectively.

R. Echard et al. have proposed an LDPC code that can be simply encoded, the LDPC code being capable of obtaining relatively excellent performance by constructing a parity check matrix in the above-stated manner. However, they have scarcely mentioned the π-rotation pattern for generating parity check matrixes corresponding to other code rates except the rate ½. Therefore, research should be conducted on technology related to the π-rotation pattern, and it is difficult to apply the state-of-the-art technology to the system.

Each of the three types of LDPC codes described above has advantages and disadvantages. For example, disadvantageously, the LDPC codes cannot be processed on a real-time basis, and cannot be easily extended. Therefore, the current mobile communication system has difficulty in using the LDPC code for an encoding technique, and even the next generation mobile communication system cannot employ the methods stated above.

SUMMARY OF THE INVENTION

It is, therefore, an object of the present invention to provide an apparatus and method for encoding a Low Density Parity Check (LDPC) code that can be processed in real-time.

It is another object of the present invention to provide an apparatus and method for encoding an LDPC code that can be easily extended.

It is further another object of the present invention to provide an apparatus and method for encoding an LDPC code for which inverse matrixes can be easily calculated.

To achieve the above and other objects is achieved by providing a method for generating an encoding matrix for a low density parity check (LDPC) code having a dual-diagonal matrix as a parity check matrix. The method comprises constructing an information sub-matrix of the encoding matrix with a predetermined number of square matrixes according to a predetermined code rate such that each of the square matrixes has columns and rows with a weight of 1 and has a different offset value, and combining the square matrixes with the dual-diagonal matrix; and performing inter-row permutation on the information sub-matrix.

BRIEF DESCRIPTION OF THE DRAWINGS

The above and other objects, features and advantages of the present invention will become more apparent from the following detailed description when taken in conjunction with the accompanying drawings in which:

Figures 1C, 1D:
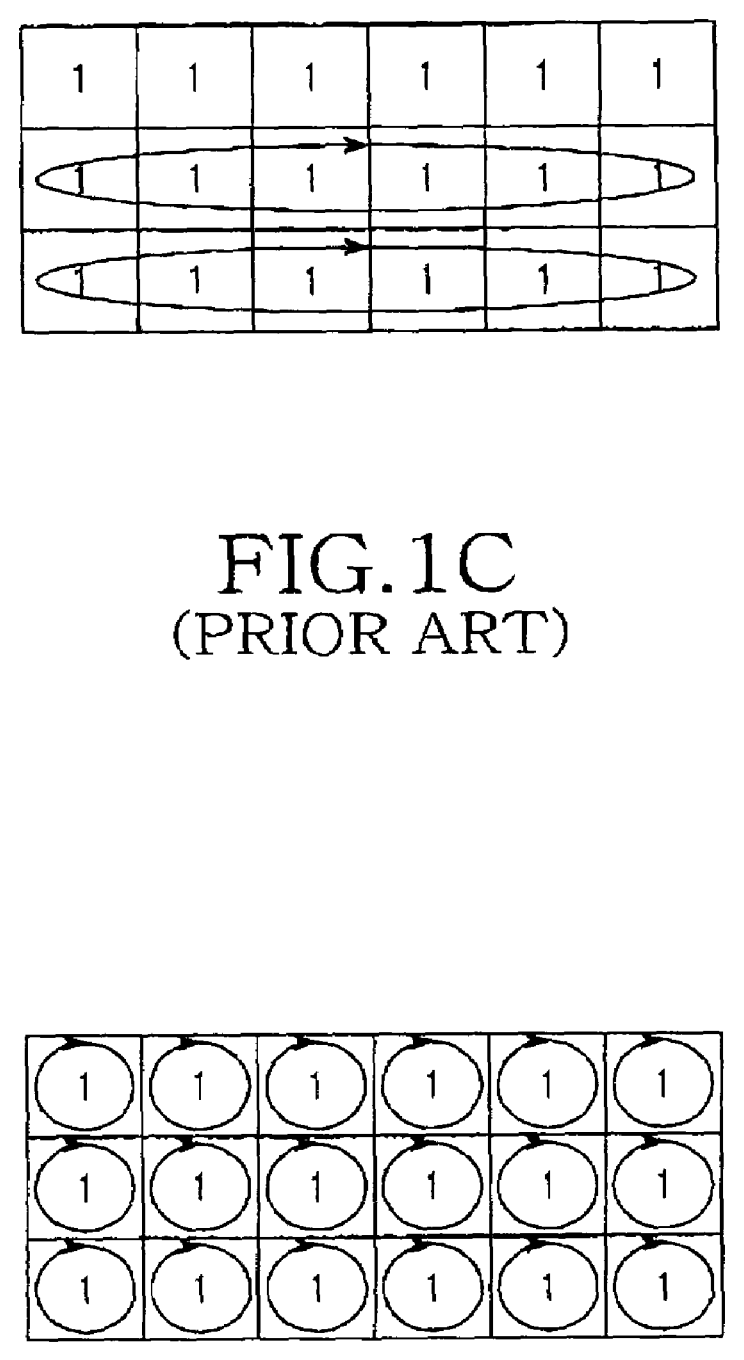

FIGS. 1A through 1D are diagrams illustrating a conventional method for generating a parity check matrix for a Low Density Parity Check (LDPC) code proposed by MacKay and Neal;

In the drawings, the same or similar elements are denoted by the same reference numerals even though they are depicted in different drawings.

DETAILED DESCRIPTION OF THE PREFERRED EMBODIMENT

A preferred embodiment of the present invention will now be described in detail with reference to the accompanying drawings. In the following description, a detailed description of known functions and configurations incorporated herein has been omitted for conciseness.

Figure 1A:
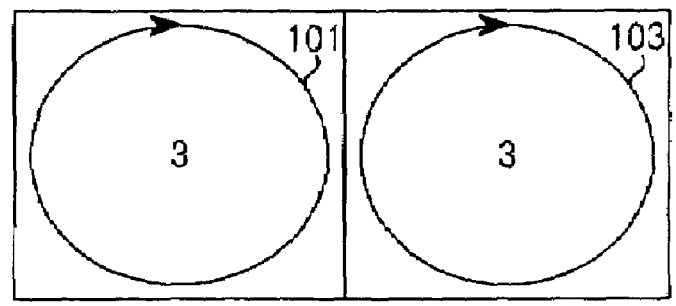
Figure 1B:
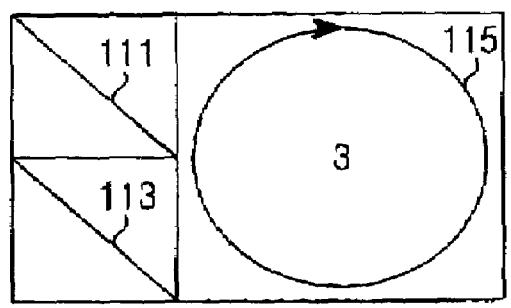
Figure 2:
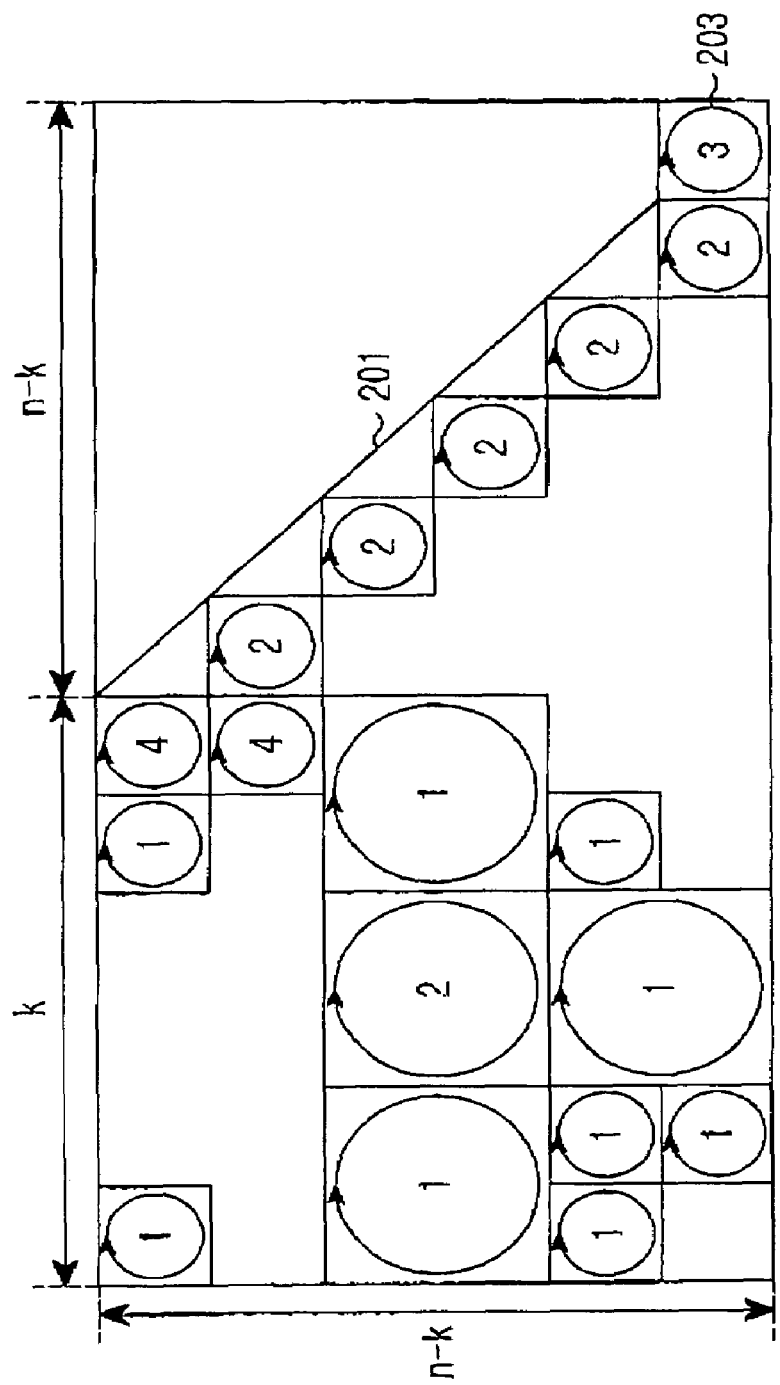
FIG. 2 is a diagram illustrating a structure of a matrix generated by a conventional parity check matrix generation method for an LDPC code proposed by MacKay.
Figure 3:
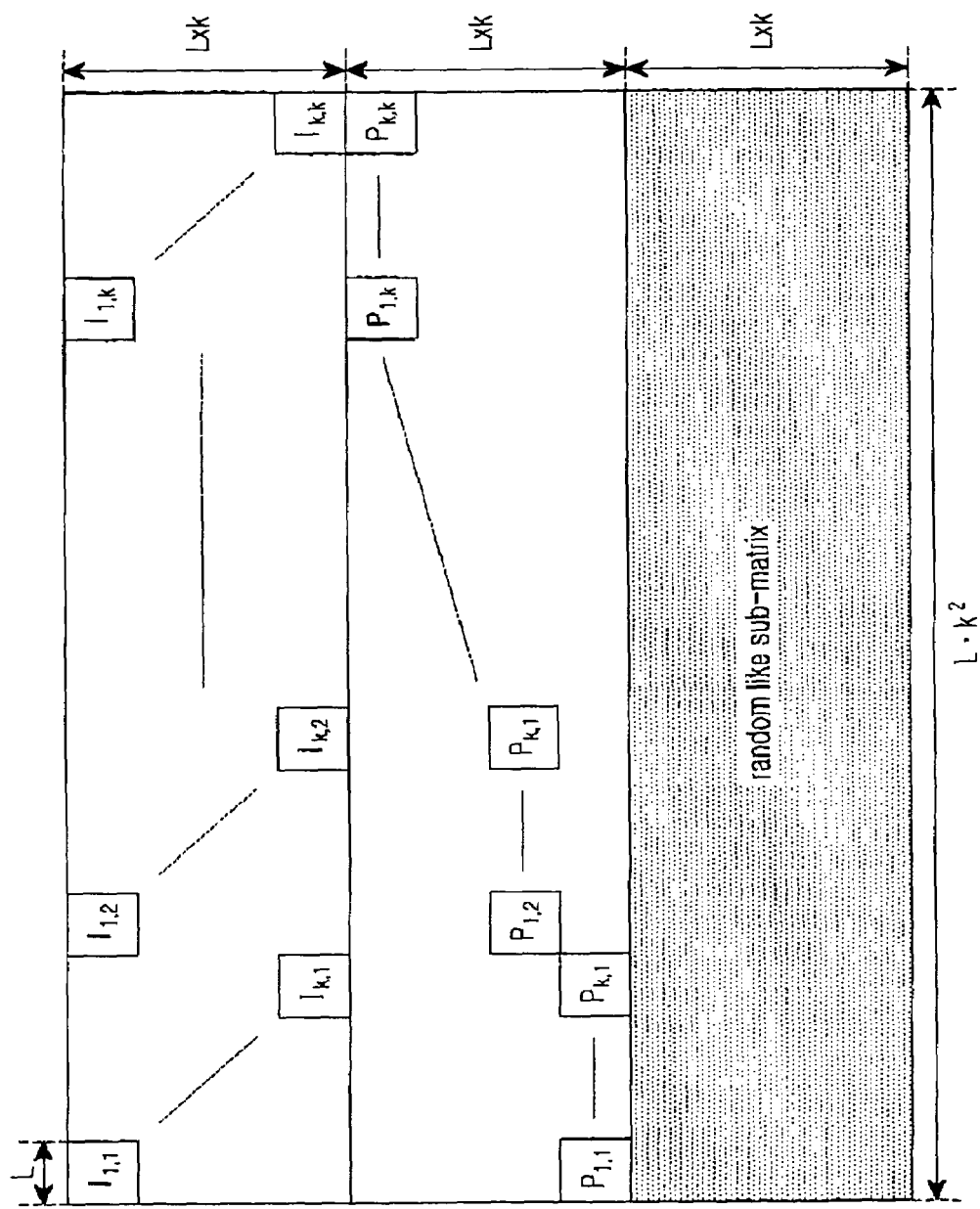
FIG. 3 is a diagram illustrating a structure of a matrix generated by a conventional parity check matrix generation method for an LDPC code proposed by T. Zahng and K. Parhi.
Figure 4:
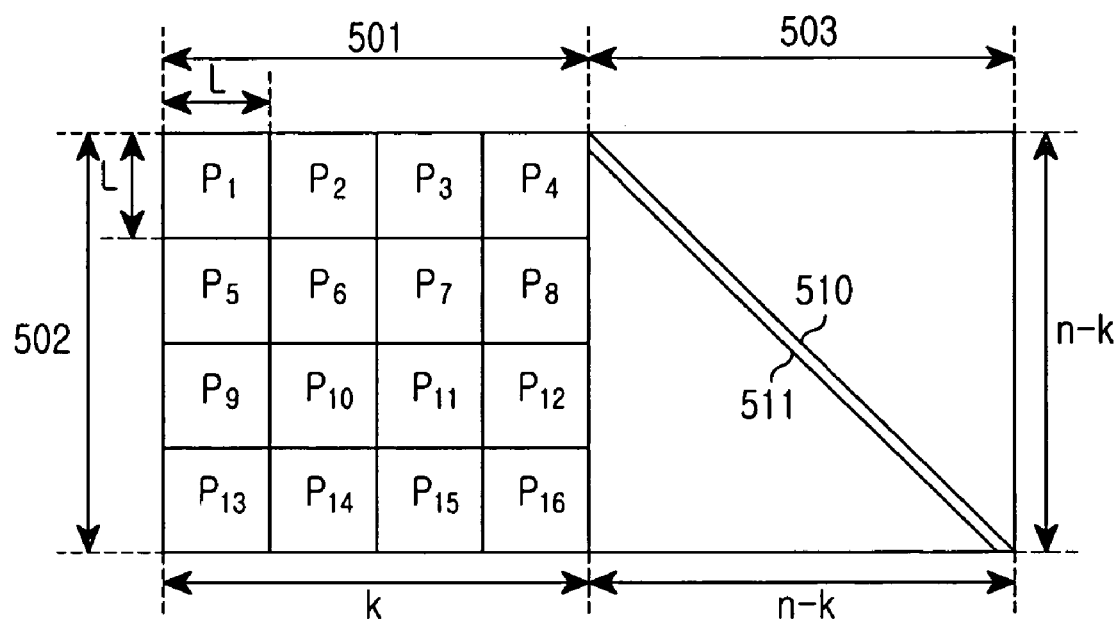
FIG. 4 is a diagram illustrating a structure of a rate=½ parity check matrix according to an embodiment of the present invention.

A regular Low Density Parity Check (LDPC) code proposed in an embodiment of the present invention is constructed based on a structure of the semi-random LDPC code described in the "Related Art" section. A structure of an LDPC code according to an embodiment of the present invention is illustrated in FIG. 4. FIG. 4 is a diagram illustrating a structure of a rate=½ parity check matrix according to an embodiment of the present invention. Roughly, an encoding matrix for an LDPC code according to an embodiment of the present invention is constructed in the following two processes.

A first process will now be described herein below. As illustrated in FIG. 4, an LDPC code is implemented in order to simplify an encoding structure and enable real-time encoding. In FIG. 4, if L=(n−k)/(column weight in $H^d$)=k/(row weight in $H^d$) and a rate=½, weights of rows 502 and columns 501 in a sub-matrix H corresponding to an information part are both 4. That is, each of sub-matrixes $P_1$ to $P_{16}$ is an L×L square matrix, and each of the sub-matrixes $P_1$ to $P_{16}$, becomes a matrix in which even though any row and column are selected the number of 1s in the selected row and column is 1. In other words, the sub-matrixes $P_1$ to $P_{16}$ each become a square matrix in which weights of row and column are both 1. A set of the sub-matrixes $P_1$ to $P_{16}$ becomes a matrix providing information. In addition, a part represented by reference numeral 503 has a dual-diagonal matrix. Therefore, reference numerals 510 and 511 refer to arrangements of 1s in a parity sub-matrix. That is, one encoding matrix for an LDPC code is calculated by combining the information part matrix with the dual-diagonal matrix. A sub-matrix $P_i$ indicating a value of the information is a permutation matrix of a unit matrix based on a particular offset value $b_i$. That is, the sub-matrix $P_i$ is a matrix obtained by cyclic-shifting each column of a unit matrix by $b_i$. A value of $b_i$ is defined such that a difference between $b_i$ and $b_{i-1}$ becomes a power $q^i$ of a particular integer q. In the first process according to an embodiment the present invention, such a structure of a matrix is constructed.

Next, a description will be made of a process, i.e., a second process, of completing an encoding matrix for an LDPC code using a matrix having such a form. If the value $q^i$ is larger than L, a modulo operation is performed with a prime integer PL which is larger than L and approaches L. The $q^i$ and the $b_i$ are defined by $$q^i = (q^{i-1} \times q) \bmod p_L$$

$$b_i = (b_{i-1} + q^i) \bmod L \quad (6)$$

In Equation (6), a particular integer q is experimentally determined. The matrix is constructed in this manner to reduce errors which may occur due to permutation of values in each row. A typical example will be described below. If each row is comprised of 6 elements, a prime integer which is larger than 6 and nearest to 6 becomes 7. Therefore, a primitive element is calculated which is close to 7 and can calculate all integers through a modulo operation on 7 in the form of a power. In this case, the following two conditions should be satisfied in order to correctly permute the matrixes and combines the permuted matrixes.

(1) The matrixes should not have the order of 0, 1, 2, 3, . . . , 6.

(2) All numerals included in the set should appear only once.

That is, the above two conditions should be satisfied in order for the order to be randomized, and in order to implement this, an operation method of Equation (6) below is selected in an embodiment of the present invention. In the following description, an operation of Equation (6) is called "prime modulo operation." In an example of the prime modulo operation, an experimentally selected primitive element value can become 3. If the primitive element has a value of 3, each row is permuted as stated below.

First, because a first power of 3 becomes $3^1=3$, a first row is located in a third row. Next, because a second power of 3 becomes $3^2=9$, 2 is determined by a modulo-7 operation and a second row is permuted to a second row. Because a third power of 3 becomes $3^3=27$, a third row is permuted to a sixth row by a modulo-7 operation. Because a fourth power of 3 becomes $3^4=81$, a fourth row is permuted to a fourth row by a modulo-7 operation. Because a fifth power of 3 becomes $3^5=243$, a fifth row is permuted to a firth row by a modulo-7 operation. Because a sixth power of 3 becomes $3^6=729$, a sixth row is permuted to a first row. In this manner, all rows can be permuted without being overlapped. By doing so, it is possible to reduce an error rate of encoded symbols.

Summarizing the methods stated above, after the matrix of FIG. 4 is constructed, an (n−k)×k sub-matrix $H^d$ for an information part undergoes inter-row permutation by the following rules.

(1) A prime integer $p_M$ which is larger than the number (n−k) of rows for an information sub-matrix and closest to (n−k) is calculated.

(2) A primitive element $p_e$ that can express all integers of 1 to ($p_M$−1) in the form of a power is calculated.

(3) If the number of rows of 1 to (n−k) is called j, inter-row permutation π(j) is performed on each row by mapping of Table 1 below.

TABLE 1

```
π(1) = p_e
for (j=2; j<=n~k; j++)
    π(j) = (π(j-1) x p_e) mod p_M
    if (π(j)>n-k)
        do π(j) = (π(j) x p_e) mod p_M
        while (π(j)>n-k)
    end do
end if
end for
```

Through Table 1, it is possible to map one row to another row on a one-to-one basis using a pseudo-random rule. By performing such inter-row permutation, it is possible to prevent generation of a low-weight codeword. If a low-weight codeword is generated, an error floor occurs during decoding. In addition, an undetected error occurs causing performance degradation of an LDPC code because such a low-weight codeword generates an undesired codeword having a Hamming weight when a parity check matrix is constructed. In the second process according to an embodiment of the present invention, the information matrix undergoes row permutation.

Figure 5:
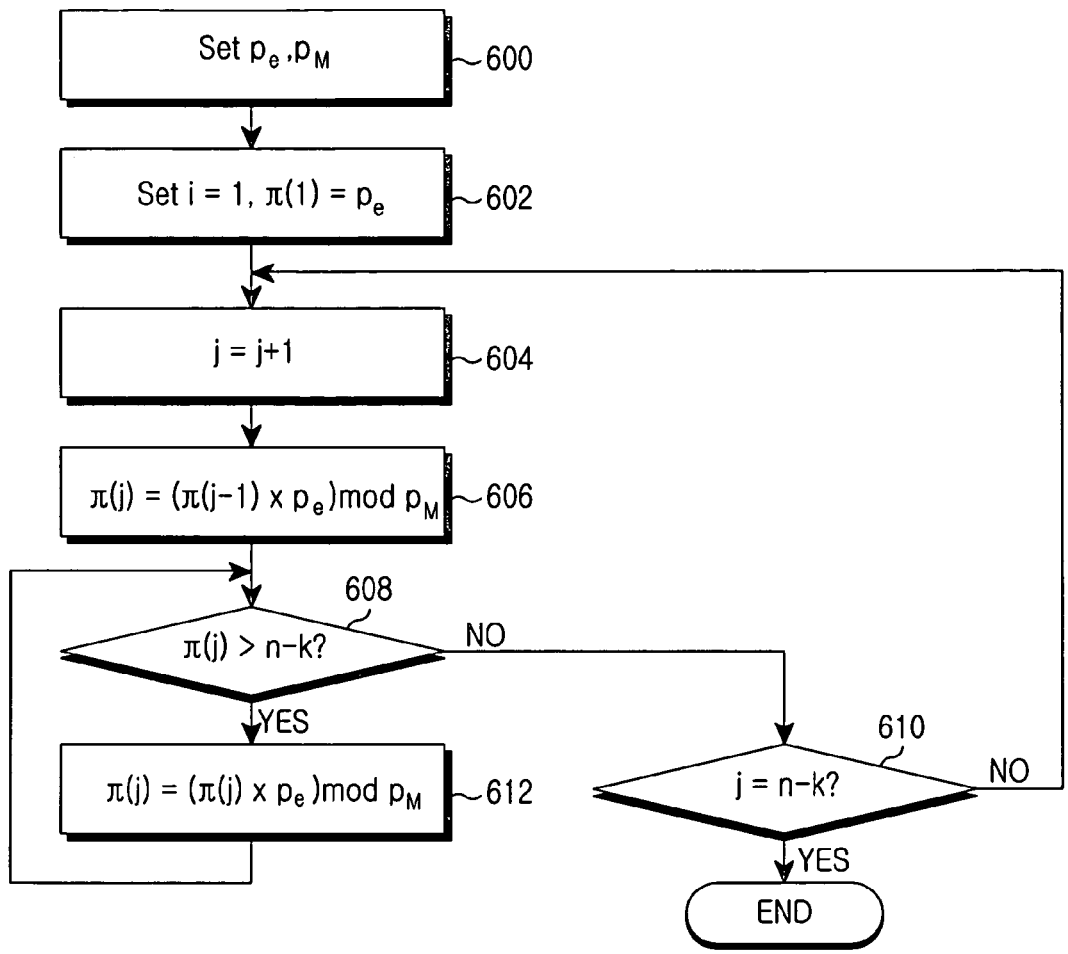
FIG. 5 is a flowchart illustrating a process of generating an interleaving address π(j) according to a prime interleaving rule.

FIG. 5 is a flowchart illustrating a process of generating an interleaving address π(j) according to a prime interleaving rule shown in Table 1. Referring to FIG. 5, in step 600, a primitive element $p_e$ and a prime integer $p_M$, which is larger than the number of rows and is closest to the number of rows, are set for a sub-matrix of information calculated in the process of (1). Thereafter, in step 602, an i value is set to '1' and a first row π(1) for inter-row permutation is set to a primitive element $p_e$. After the setting, a j value is increased by 1 in step 604, and π(j) of a $j^{th}$ column is calculated in step 606 using Equation (7) below.

$$\pi(j) = (\pi(j-1) \times p_e) \bmod p_M \quad (7)$$

Equation (7) provides a calculation for changing a set value of a row. That is, Equation (7) is used to determine a position of a target row by performing a modulo operation on a power value of the primitive element with the calculated prime integer $p_M$.

After the calculation of Equation (7) is performed in step 606, it is determined in step 608 whether the calculated value is larger than the number of rows. When the total number of rows is 10 and a value of a current row is 2, if a value of a target row is 11 or 12, the target row is invalid. In order to prevent such a phenomenon, it is determined whether the calculated value is larger than the total number of rows. If the calculated value is larger than the total number of rows, calculation of Equation (8) below is performed in step 612. Equation (8) is identical to Equation (7), except that a calculated value j is increased by 1. Through this calculation, the same value occurs only once. Occasionally, two or more values larger than a value of a row can exist. Even in this case, step 608 is performed again after step 612 to thereby prevent a change to a row whose value is larger than the number of rows.

$$\pi(j) = (\pi(j) \times p_e) \bmod p_M \quad (8)$$

After the calculation of Equation (8), if it is determined in step 608 that the calculated value is not larger than the number of rows, it is determined in step 610 whether the inter-row permutation has been repeated as many times as the number of rows. If the inter-row permutation has been repeated as many times as the number of rows, the routine is terminated, completing one matrix for extracting an encoded symbol. However, when the matrix is not completed, the routine returns to step 604 and repeats the processes stated above.

Figure 6A:
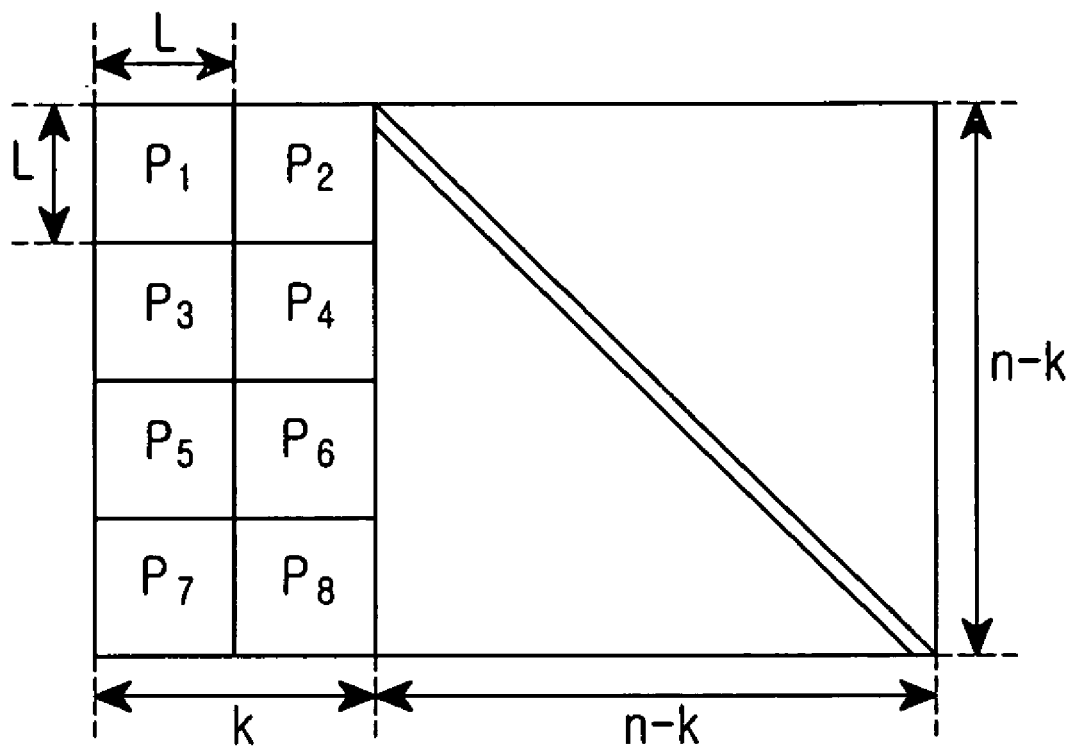
FIGS. 6A through 6C are diagrams illustrating structures of parity check matrixes for an LDPC code according to an embodiment of the present invention.
Figure 6B:
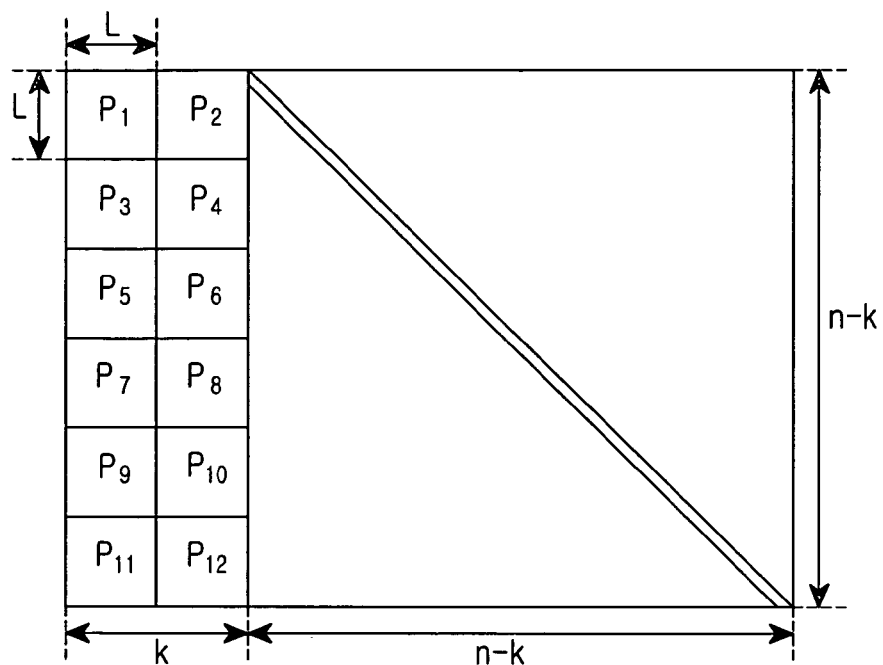
Figure 6C:
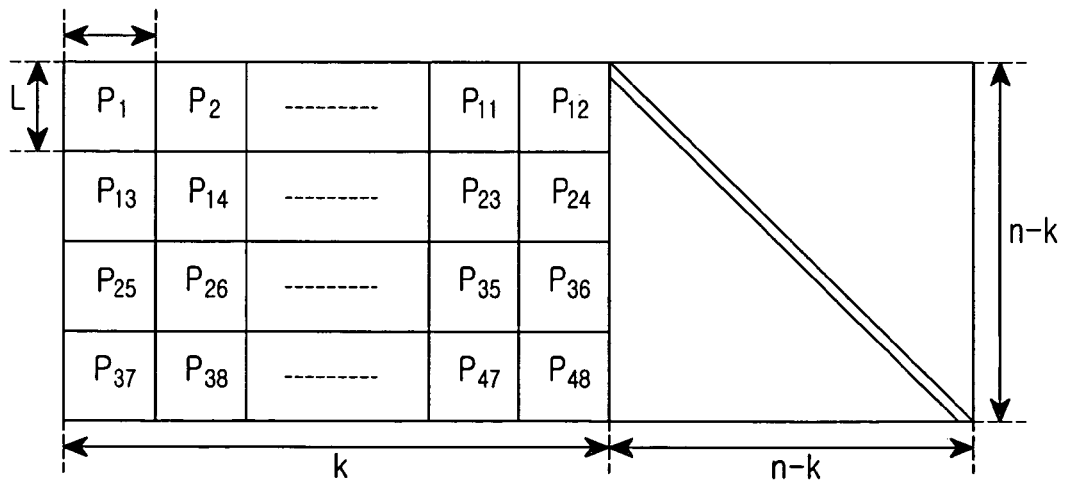

FIGS. 6A through 6C are diagrams illustrating structures of parity check matrixes for an LDPC code, calculated through the method stated above. FIG. 6A illustrates a structure of a parity check matrix for a rate=⅓ LDPC code, FIG. 6B illustrates a structure of a parity check matrix for a rate=¼ LDPC code, and FIG. 6C illustrates a structure of a parity check matrix for a rate=¾ LDPC code.

Figure 7:
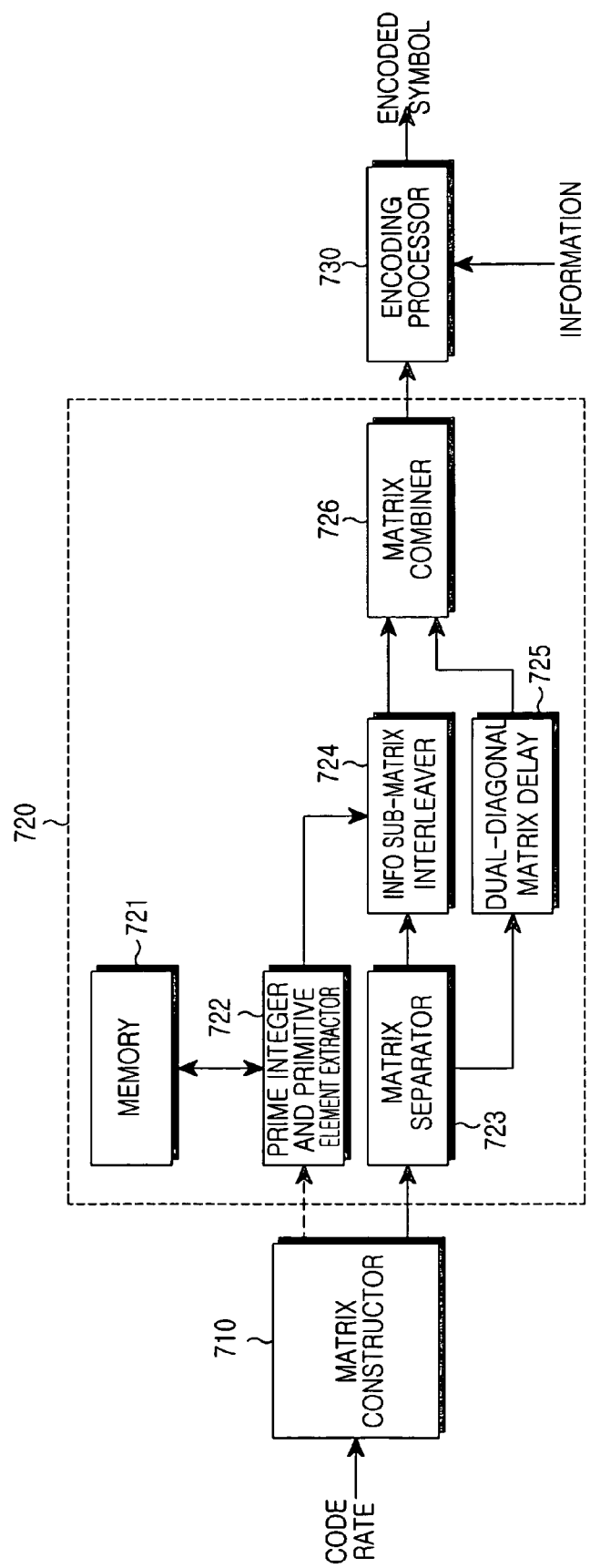
FIG. 7 is a block diagram illustrating a matrix generator for generating an LDPC code and an encoding apparatus according to an embodiment of the present invention.

FIG. 7 is a block diagram illustrating a matrix generator for generating an LDPC code and an encoding apparatus according to an embodiment of the present invention. A description will now be made of a generator for generating LDPC codes shown in FIGS. 6A through 6C, block elements of an encoder according thereto, and an operation of each element according to an embodiment of the present invention.

A matrix constructor 710 receives information on a set code rate and generates a matrix for an initial LDPC code based on the received information. Generating a matrix for an initial LDPC code is equivalent to constructing a sub-matrix and a dual-diagonal matrix corresponding to the received information. A sub-matrix corresponding to the received information can be constructed through a combination of square matrixes having a weight of 1. Here, the square matrix is obtained by adding an offset value to a simple matrix having a weight value of 1 and shifting the offset-added matrix.

The matrix constructor 710 outputs the matrix constructed in the above manner, and at the same time, outputs information on the number of rows through a dotted-line. The output of the matrix constructor 710 is input to an inter-row permutation apparatus 720. A value of the number of rows is input to a prime integer and primitive element extractor 722. The prime integer and primitive element extractor 722 extracts corresponding prime integer and primitive element from a memory 721 that stores a prime integer and a primitive element value determined according to the value of the number of rows. The extracted values are output to an information sub-matrix interleaver 724.

A matrix value output from the matrix constructor 710 is input to a matrix separator 723 in the inter-row permutation apparatus 720. The matrix separator 723 separates an input matrix into an information sub-matrix (or sub-matrix for an information part) and a dual-diagonal sub-matrix (or sub-matrix for a dual-diagonal sub-matrix). The output sub-matrixes are input to different devices. The information sub-matrix is input to the information sub-matrix interleaver 724, and the dual-diagonal sub-matrix is input to a dual-diagonal matrix delay 725. The information sub-matrix interleaver 724 performs inter-row permutation on the information sub-matrix according to the rule described in connection with FIG. 5, Table 7 and Table 8. Therefore, the dual-diagonal matrix delay 725 delays the input dual-diagonal sub-matrix by an operation time required at the information sub-matrix interleaver 724.

The interleaved information sub-matrix and the delayed dual-diagonal sub-matrix are input separately to a matrix combiner 726. The matrix combiner 726 combines the two sub-matrixes into a combined matrix. Through such a process, an LDPC encoding matrix can be constructed.

In an embodiment of the present invention, the encoding apparatus can also be constructed in a transmitter. Alternatively, if several particular code rates for a communication system are selectively used, encoding matrixes matched thereto are previously generated and then extracted from the memory. Also, an apparatus for the above method can be implemented.

The matrix value output from the inter-row permutation apparatus 720 is input to an encoding processor 730, and the encoding processor 730 generates encoded symbols according to input information.

Figure 8:
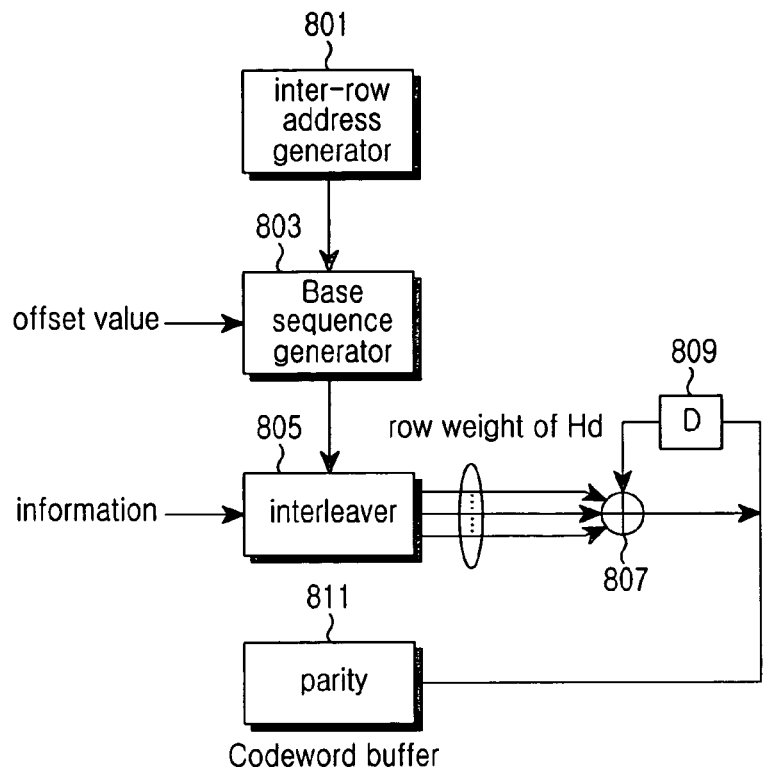
FIG. 8 is a block diagram illustrating an encoder for generating an LDPC code according to an embodiment of the present invention.

An apparatus for performing such an operation will now be described with reference to the accompanying drawing. FIG. 8 is a block diagram illustrating an encoder for generating an LDPC code according to an embodiment of the present invention.

Information comprises a series of bits, and is stored in a systematic part of a codeword buffer illustratively shown as interleaver 805. Because a process of encoding an LDPC code specified in an embodiment of the present invention corresponds to a series of processes of sequentially generating (n–k) parity bits by applying (n–k) parity check formulas corresponding to (n–k) columns, an apparatus for indicating a position where '1' exists in an $H^d$ matrix in each of (n–k) columns is required. Because the position of '1' is determined by an offset value of initial P matrixes shown in FIG. 4 and an inter-row permutation method of an $H^d$ matrix comprising P matrixes, an inter-row address generator 801 and an offset value are required. A sequence for a position of '1' existing in each column of an $H^d$ matrix that can be generated by the inter-row address generator 801 and the offset value is called a base sequence, and an apparatus for generating the base sequence is called a base sequence generator 803. A sequence generated by the base sequence generator 803 indicates a position where 1 exists in a particular column of an $H^d$ matrix. Information bits are read from the interleaver 805 in which information bits are stored according to the sequence of the bits, new parity bits are generated by adding the read information bits to previous parity bits (modulo 2 sum 807), and then, the parity bits generated are stored in a parity buffer 811. If such a process has been performed on all of (n–k) columns, all of (n–k) parity bits are completely stored in the parity buffer 811, and accordingly, an encoded LDPC codeword is generated and stored in a codeword buffer comprising the systematic buffer 805 and the parity buffer 811. The codeword is input to delay 809, which provides the codeword to modulo 2 sum 807.

If a parity check matrix for an LDPC code is generated in the almost regular form in the above manner, encoding can be advantageously performed in a very regular method by an encoder. In addition, the encoder can perform real-time encoding like the turbo encoder. Besides, it is possible to define a predetermined number of memories for a variable node for a parallel LDPC decoder for each node. Therefore, the proposed LDPC code is superior to an irregular LDPC code in implementation of a decoder.

Simulation and Analysis

In this section, a description will be made of a simulation result and Bit Error Rate (BER) and Frame Error Rate (FER) performance for an LDPC code generated according to an embodiment of the present invention. In order to determine whether an LDPC code construction method proposed herein can show stable performance according to code rates and block sizes, simulations were performed for various code rates and block sizes.

The followings are simulation environments set for performance check of an LDPC code.

Figure 9:
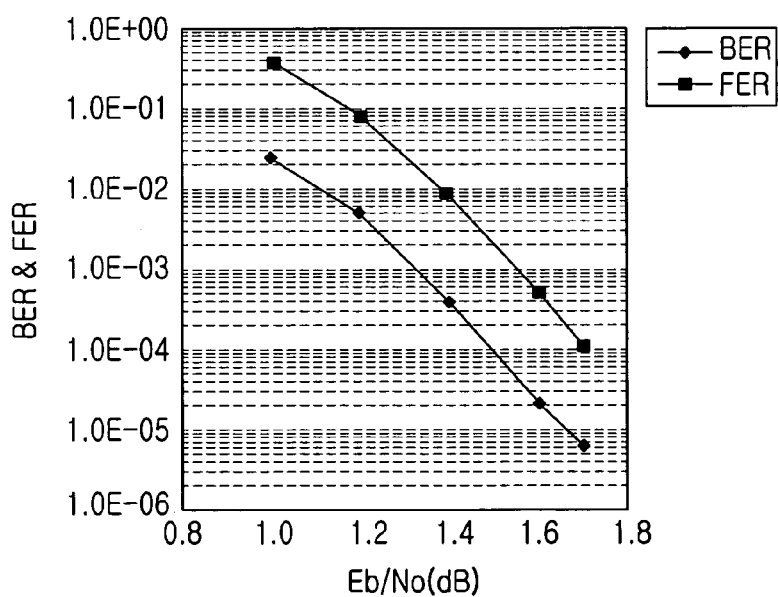
FIG. 9 is a graph illustrating simulation results on Bit Error Rate (BER) and frame error rate (FER) performance for an n=400, k=2000, R=½ LDPC code.

Floating point simulation
BPSK modulation and AWGN channel
Interactive belief propagation decoding
Maximum 100 or 50 iterations FIG. 9 is a graph illustrating simulation results on BER and FER performance for an n=400, k=2000, R=½ LDPC code. An initial value q for generating a parity check matrix was set to 18. In the simulation process, no undetected error was generated. An LDPC code is generally characterized in that an undetected error is scarcely generated at a high SNR. In addition, it should be noted that unlike the turbo code, the LDPC code has a little difference between BER and FER. This indicates that relatively many errors occur in a defective frame at the same time. Unlike the LDPC code, the turbo code has many frames where a relatively small number of errors of about 2 to 4 bits occur in each frame at a high SNR. Many errors occur in a defective frame because the LDPC code is larger than the turbo code in a minimum distance. Accordingly, the LDPC code is superior to the turbo code even in a frame error rate at $E_b/N_0$ where it has a low-undetected error rate and the same bit error rate (BER).

Figure 10:
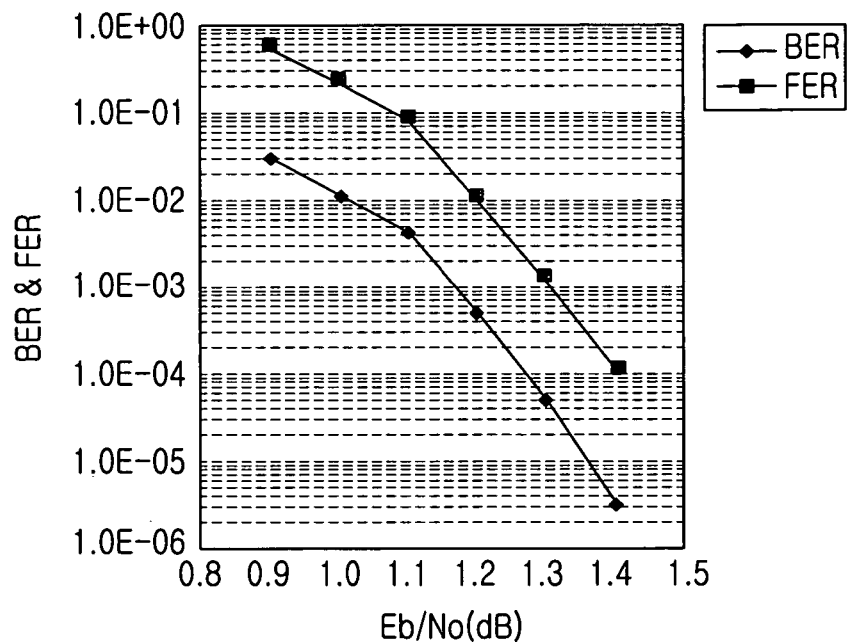
FIG. 10 is a graph illustrating simulation results on BER and FER performance for a block size that is increased to 5000 for the same code rate.

FIG. 10 is a graph illustrating simulation results on BER and FER performance for a block size that is increased to 5000 for the same code rate. An initial value q for generating a parity check matrix was also changed to 19. It should be noted that as the block size increases from 2000 to 5000, the LDPC code shows better performance at the same code rate. Further, it should be understood that the as the lock size increases, an occurrence rate of a low weight codeword is reduced in a parity check matrix, so that even though the SNR increases, no error floor occurs. Even in this simulation, it should be noted that no undetected error is generated and an error of several tens to several hundreds of bits occurs in a defective frame at a time.

Figure 11:
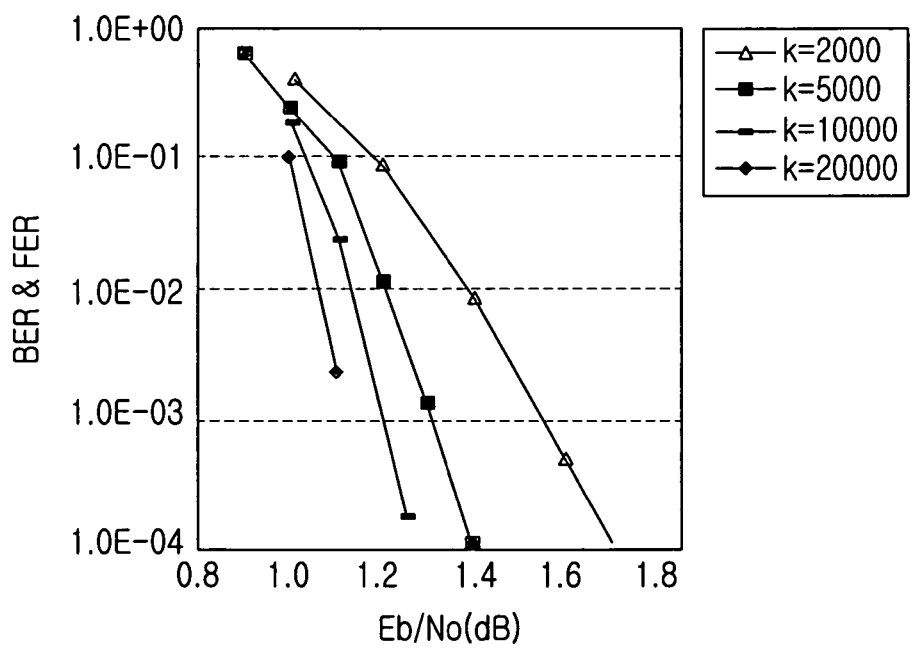
FIG. 11 is a graph illustrating simulation results on FER performance for block sizes of 2000, 5000, 10000 and 20000 at R=½.

FIG. 11 is a graph illustrating simulation results on FER performance for block sizes of 2000, 5000, 10000 and 20000 at R=½. A value q was set to 22 for the block size of 10000 and 20000. It should be noted in FIG. 11 that for the same code rate, as a block size increases, a slope of FER performance becomes steeper. This indicates that as a block size increases, the weight distribution of the LDPC code improves showing better performance. No undetected error was generated in the simulations on all cases for a code rate R=½. This shows that the LDPC code proposed by an embodiment of the present invention has a sufficiently large minimum distance.

As understood from the foregoing description, the use of a low density parity encoding technique according to embodiments of the present invention facilitates extension of a code and implementation of real-time processing. In addition, the new low density parity encoding technique contributes to simplification of an encoder structure. Further, an inverse matrix required for decoding can also be simply calculated.

While the invention has been shown and described with reference to an embodiment thereof, it will be understood by those skilled in the art that various changes in form and details may be made therein without departing from the spirit and scope of the invention as defined by the appended claims.

What is claimed is:

1. A method for generating an encoding matrix for a low density parity check (LDPC) code having a dual-diagonal matrix as a parity check matrix, the method comprising the steps of:
   (a) constructing an information sub-matrix of the encoding matrix with a predetermined number of square matrixes according to a predetermined code rate such that each of the square matrixes has columns and rows with a weight of 1 and has a different offset value, and combining the square matrixes with the dual-diagonal matrix;
   (b) performing inter-row permutation on the information sub-matrix.

2. The method of claim 1, wherein the step (b) comprises the step of:
   determining a prime integer which is closet to the number of rows among integers larger than the number of the rows in the information sub-matrix;
   calculating a primitive element by calculating a power for all integers smaller than the determined prime integer and then performing a modulo operation on the calculated power; and
   performing inter-row permutation according to the calculated primitive element.

3. An apparatus for generating an encoding matrix for a low density parity check (LDPC) code having a dual-diagonal matrix as a parity check matrix, the apparatus comprising:
   a matrix constructor for constructing an information sub-matrix of the encoding matrix with a predetermined number of square matrixes according to a predetermined code rate such that each of the square matrixes has columns and rows with a weight of 1 and has a different offset value, and combining the square matrixes with the dual-diagonal matrix; and
   an inter-row permutation apparatus for performing inter-row permutation on the information sub-matrix.

4. The apparatus of claim 3, further comprising an encoding processor for encoding input information using an output matrix of the inter-row permutation apparatus.

5. The apparatus of claim 3, wherein the inter-row permutation apparatus comprises:
   a prime integer and primitive element extractor for determining a prime integer and a primitive element according to the number of rows in the encoding matrix output from the matrix constructor;
   a matrix separator for separating the encoding matrix output from the matrix constructor into an information sub-matrix and a dual-diagonal sub-matrix;
   an information sub-matrix interleaver for performing inter-row permutation on the information sub-matrix using the primitive element and the prime integer;
   a dual-diagonal matrix delay for delaying a value of the dual-diagonal sub-matrix by a predetermined time; and
   a matrix combiner for combining an output of the dual-diagonal matrix delay with an output of the information sub-matrix interleaver.

6. An apparatus for generating an encoding matrix for a low density parity check (LDPC) code having an information sub-matrix and a dual-diagonal sub-matrix as a parity check matrix, the apparatus comprising:
   an inter-row address generator for outputting a position value of 1 in the information sub-matrix;
   a base sequence generator for receiving an offset value for the information sub-matrix and generating a base sequence for the position of 1;
   a systematic part for storing input information, and outputting information on a position according to the base sequence output from the base sequence generator;
   an adder for generating a parity value by adding information output from the systematic part to a previous parity value; and
   a delay for delaying an output of the adder by a predetermined time and outputting the delayed value to the adder.

* * * * *